United States Patent [19]

Hayashi

[11] Patent Number: 4,769,798
[45] Date of Patent: Sep. 6, 1988

[54] SUCCESSIVE PERIOD-TO-VOLTAGE CONVERTING APPARATUS

[75] Inventor: Mishio Hayashi, Saitama, Japan

[73] Assignee: Advantest Corporation, Tokyo, Japan

[21] Appl. No.: 151,181

[22] Filed: Feb. 1, 1988

[30] Foreign Application Priority Data

Feb. 4, 1987 [JP] Japan .................. 62-25326

[51] Int. Cl.$^4$ ............................................. G04F 8/00
[52] U.S. Cl. .................................... 368/121; 368/120
[58] Field of Search ................................ 361/113–123; 328/129.1, 130.1

[56] References Cited

U.S. PATENT DOCUMENTS

| | | | |
|---|---|---|---|
| 3,365,799 | 1/1968 | Fisher | 368/120 |
| 3,370,231 | 2/1968 | Zurk | 368/120 |
| 4,504,155 | 3/1985 | Ruggieri | 368/121 |

*Primary Examiner*—Bernard Roskoski
*Attorney, Agent, or Firm*—Staas & Halsey

[57] ABSTRACT

An apparatus which successively converts the period defined by successive two pulses of a series of input pulses into a voltage, and in which fractional times between input pulses and clock pulses are converted, by two fractional time-to-voltage converters alternately with each other, into voltage signals and the voltage signals thus alternately yielded by the two converters are alternately applied, by a change-over switch, to a subtractor, wherein a later one of the two successive voltage signals is always subtracted from the earlier one of them, creating a difference signal therebetween. At the same time, the number of clock pulses present between the two input pulses corresponding to the two voltage signals is counted and the count value is converted to analog form, which is added to the difference signal, obtaining the voltage corresponding to the period between the two input pulses.

22 Claims, 4 Drawing Sheets

SUCCESSIVE PERIOD-TO-VOLTAGE CONVERTING APPARATUS

BACKGROUND OF THE INVENTION

The present invention relates to a successive period-to-voltage converting apparatus which is suitable for use in the measurement of a variance in the speed of, for instance, a motor or engine.

The duration of an input pulse, i.e. its time length is usually measured by use of such an apparatus as disclosed in U.S. Pat. No. 4,611,926, for example. This apparatus includes a gate circuit, a clock generator, and a counter. With this apparatus, the gate circuit is kept open during the duration of the input pulse, the number of clock pulses from the clock generator, which have passed through the gate circuit, is counted by the counter, and then the count value is obtained as a value corresponding to the measured pulse width. The measurement accuracy of such an apparatus is dependent on the frequency of clock pulses used; for example, when a 10 MHz clock is used, resolution of the measured time length will be 100 nsec. At present, however, the frequency at which the counter is operable is 500 MHz at the highest, and when a 500 MHz clock is utilized, the accuracy of time measurement will be 2 nsec or so. Accordingly, it is difficult, with such a time measuring apparatus, to conduct the time measurement with a higher degree of accuracy.

Furthermore, the above-mentioned apparatus is so arranged as to successively measure the widths of a series of pulses. When this apparatus is applied to the measurement of pulse periods, for instance, only alternate pulse periods such as those from first to second pulse, from third to fourth pulse, from fifth to sixth pulse, etc. are usually measured, but the periods from the second to third pulse, from the fourth to fifth pulse, etc. are not measured.

This defect will constitute a serious obstacle to the measurement of a variance in the speed of a precision motor or accurate measurement of a variance in the speed of an engine.

For measuring a variance in the speed of a rotating machine, it is customary in the art to employ a method in which a pulse generator is provided in association with the rotary shaft to be measured, at least one pulse is generated by the pulse generator for each rotation of the rotary shaft, and the time intervals each between two successive such pulses are measured, thereby measuring the variance in the rotating speed.

With the afore-mentioned apparatus which can measure the time interval every other pulse alone, a variance in the speed of the rotary shaft is measured only every other rotation thereof. Accordingly, the state of rotation of the rotary shaft cannot continuously be measured.

Even if a plurality of pulses are produced for each rotation of the rotary shaft, it is still impossible to measure the state of a continuous variance in the speed of the rotary shaft during one rotation thereof.

SUMMARY OF THE INVENTION

It is therefore an object of the present invention to provide a time-to-voltage converting apparatus which can be employed for high precision measurement of a variance in the speed of a rotating machine.

Another object of the present invention is to provide a successive period-to-voltage converting apparatus which permits measurement of the time interval or period between two successive pulses of a series of input pulses.

According to the present invention, a fractional time between each of successive input pulses and a corresponding clock pulse is converted into a voltage signal, by alternate one of first and second fractional time-to-voltage converters. The voltage signals from the two converters are applied to a change-over switch, in which the distribution of the voltage signals is switched so that an earlier one of the two successive voltage signals is always provided on one fixed signal path, the later voltage signal on the other fixed signal path. The two voltage signals thus switched are provided to an analog subtractor, wherein the later fractional time is always subtracted from the earlier one, obtaining a difference signal therebetween. Accordingly, this difference signal can be obtained for each period of the input pulse.

On the other hand, the number of clock pulses which are present in the period between two successive input pulses is counted by a counter, and the count value is converted by a D-A converter into an analog voltage corresponding to the number of clock pulses counted.

The analog voltage and the difference signal are applied to an adder, wherein they are added together, thereby obtaining the time interval between the successive two input pulses.

As described above, the present invention permits measurement of the period defined by successive two input pulses, for example. Accordingly, the present invention, when applied to the measurement of a variance in the speed of a rotating machine, allows continuous measurement of the state of rotation of its rotary shaft.

DESCRIPTION OF THE PREFERRED EMBODIMENTS

Figure 1:
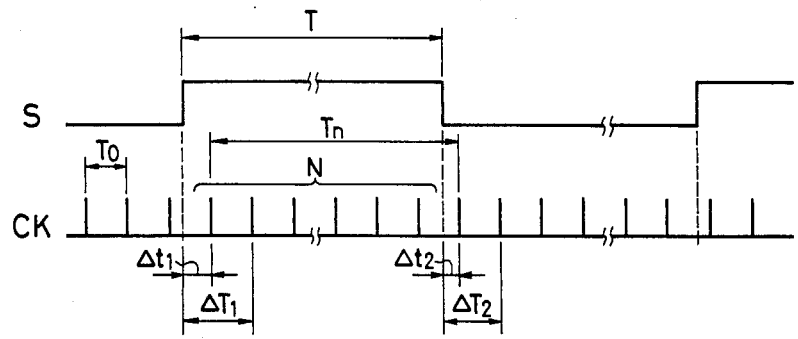
FIG. 1 is a timing chart, for explaining the known principle of time interval measurement.

A description will be given first, with reference to FIG. 1, of the known principle of measuring a time interval T. Letting a reference clock period be represented by $T_0$, the time interval T to be measured is given by the following expression:

$$T = T_n + \Delta t_1 - \Delta T_2 = N \cdot T_0 + \Delta T_1 - \Delta T_2 \tag{1}$$

where N is the number of clock pulses which are counted for the duration of an input signal S, $T_n$ is the time interval from a clock pulse generated immediately after the rise of the input signal S to a clock pulse generated immediately after the fall of the input signal S, that is, $N \cdot T_0$, and $\Delta t_1$ and $\Delta t_2$ are fractional times from the rise and fall of the input signal S to the clock pulses appearing directly after them, respectively. In this instance, each of the fractional times $\Delta t_1$ and $\Delta t_2$ shown in the middle term of expression (1) may be measured; in practice, however, since it is convenient to measure the sum total of each fractional time and an interval of a certain number K of consecutive clock pulses, measurement is usually performed following the right-hand term of expression (1). That is, $\Delta T_1$ and $\Delta T_2$ are generally expressed as follows:

$$\Delta T_1 = KT_0 + \Delta t_1 \quad (2)$$

$$\Delta T_2 = KT_0 + \Delta t_2 \quad (3)$$

It is apparent that expression (1) will hold for a given integer of K. FIG. 1 shows the case where $K=1$. The counting of clock pulses for measuring the time interval $T_n$ need not always be conducted within the time interval T to be measured alone, but the counting may also be effected from the clock pulse appearing immediately after the initiation of the interval $T_n$ to the clock pulse at the end thereof. The purpose could also be served by similarly counting the clock pulses for a period delayed behind the interval $T_n$ by a predetermined number of clocks. In practice, the time interval T is obtained with high accuracy, based on expression (1), by counting the number of clock pulses N through use of a counter and accurately measuring the fractional times $\Delta T_1$ and $\Delta T_2$ by some method.

Figure 2:
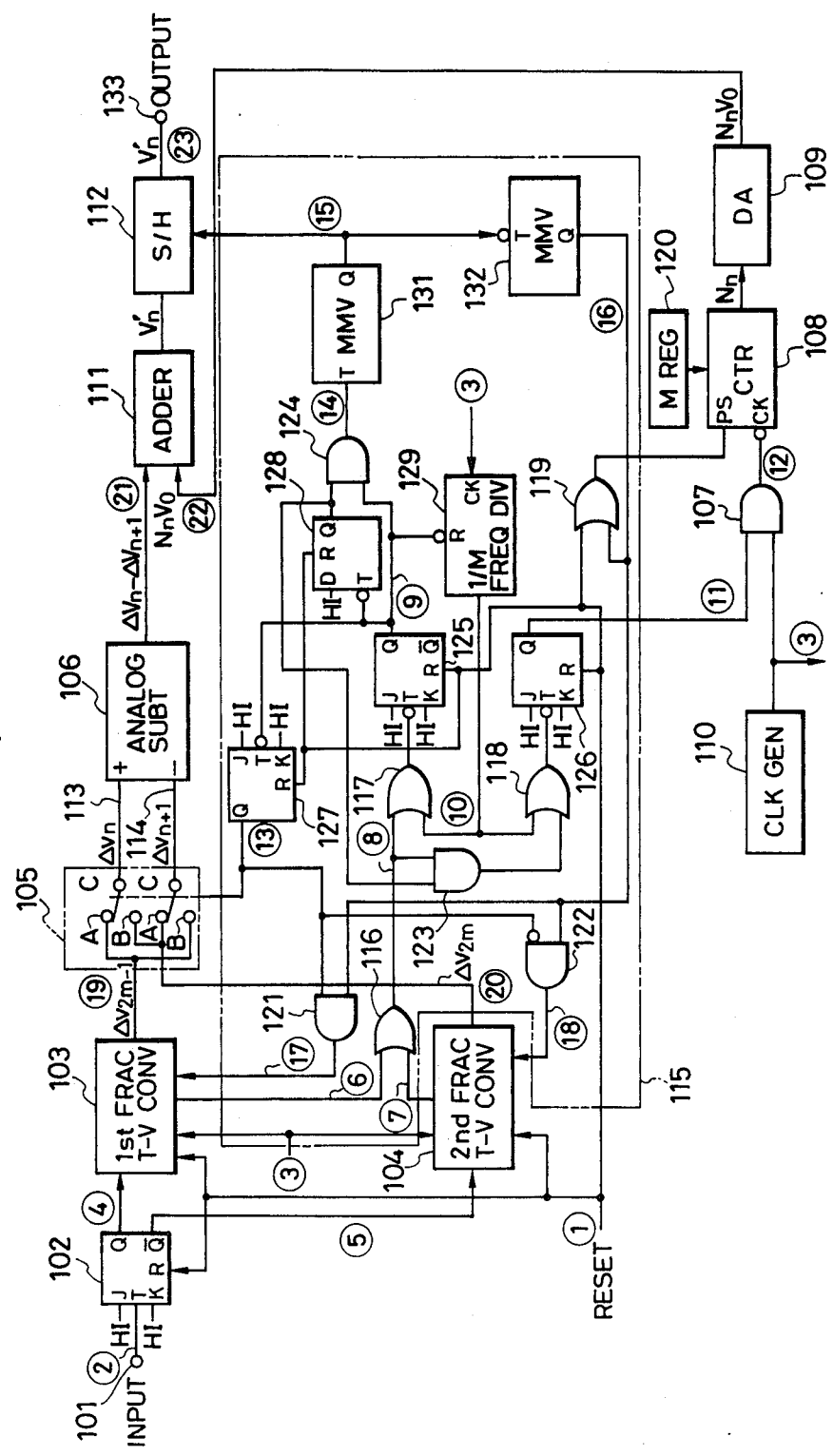
FIG. 2 is a block diagram illustrating an embodiment of the present invention.

FIG. 2 illustrates an embodiment of the present invention. The basic arrangement of the period-to-voltage converting apparatus of the present invention includes: a signal detector 102 which detects the leading or trailing edge (hereinafter only the leading edge will be referred to, for the sake of brevity) of each input pulse which is applied to an input terminal 101; first and second fractional time-to-voltage converters 103 and 104 which alternately convert to a voltage signal, for a series of input pulse, a fractional time which is defined by starting an integration with the detected output from the signal detector 102 and stopping the integration upon arrival of a predetermined number (K) of clock pulses after the initiation of the integration, that is, defined by the time interval between the rise of each input pulse and the termination of the integration; a change-over switch 105 by which earlier and later ones of two successive voltage signals from the first and second fractional time-to-voltage converters 103 and 104, in terms of the order of the time series of the corresponding input pulses, are provided on fixed signal paths 113 and 114, respectively; an analog subtractor 106 which obtains a difference signal between the voltage signals provided from the change-over switch 105, by subtracting the later voltage signal from the earlier one; a gate 107 for extracting clock pulses present in an interval corresponding to each period defined by the successive two input pulses; a counter 108 for counting the clock pulses extracted by the gate 107; a D-A converter 109 for converting the count value of the counter 108 to analog form; and an adder 111 for adding together the voltage signal from the D-A converter 109 and the difference signal from the analog subtractor 106.

When the power supply of the period-to-voltage converting apparatus is turned ON, a reset signal ① shown in FIG. 3A is generated, which is applied to respective parts of the apparatus, resetting them to their initial states. The signal detector 102 in this embodiment is formed by a JK flip-flop. The JK flip-flop 102 is supplied at its trigger terminal T with a series of input pulses ② (see FIG. 3B) applied to the input terminal 101.

The JK flip-flop 102 provides, at its output terminals Q and $\overline{Q}$, opposite-polarity rectangular waves ④ and ⑤ shown in FIG. 3D and 3E. The rectangular waves ④ and ⑤ are applied to the first and second fractional time-to-voltage converters 103 and 104, respectively.

Figure 4:
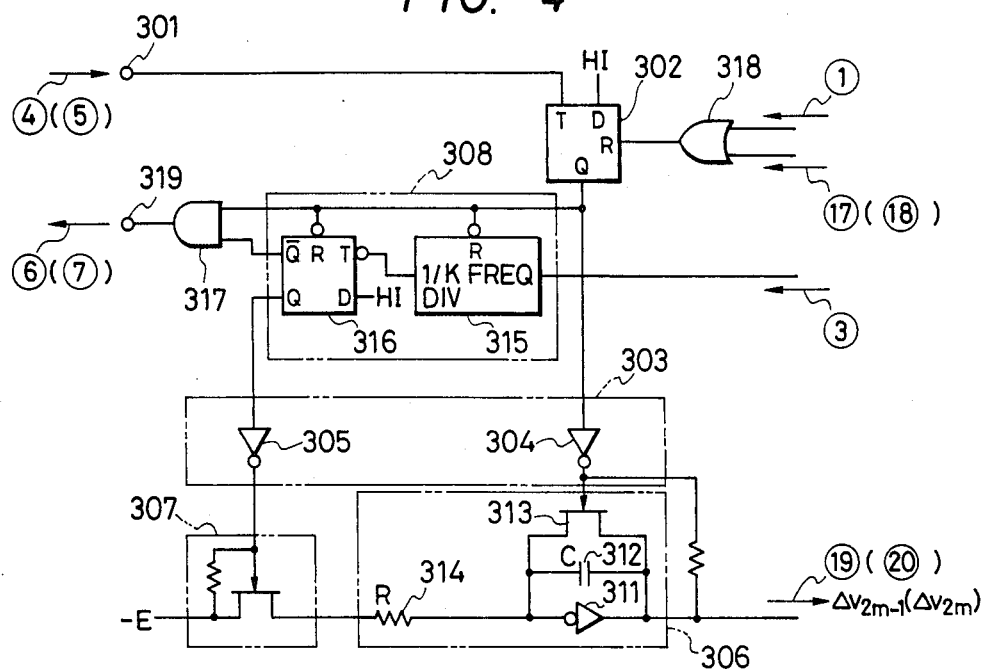
FIG. 4 is a circuit diagram showing a specific operative example of a fractional time-to-voltage converter for use in the embodiment of the present invention.

The first and second fractional time-to-voltage (hereinafter simplified as T-V) converters 103 and 104 can each be constituted as shown in FIG. 4 by a D flip-flop 302, a level converter 303, an analog integration circuit 306, an analog switch 307 for controlling the supply of an integration voltage to the analog integration circuit 306, and an integration time control circuit 308.

In FIG. 4 reference numeral 301 indicates an input terminal of each of the first and second fractional T-V converters 103 and 104. Before the application of the rectangular wave ④ or ⑤ to the input terminal 301 the D flip-flop 302 remains in its reset state and an L logic of its Q output holds the integration time control circuit 308 in its reset state. The rectangular wave ④ or ⑤ is supplied from the signal detector 102 via the input terminal 301 to the trigger terminal T of the D flip-flop 302. The D flip-flop 302 is always supplied at its data input terminal D with an H-logic signal.

With the above arrangement, the D flip-flop 302 reads thereinto the H logic at the timing of the rise of the rectangular wave ④ or ⑤ and provides the H logic at its output terminal Q. The output of the D flip-flop 302 is supplied to the analog integration circuit 306 via a buffer 304 which forms the level converter 303.

The analog integration circuit 306 is made up of an operational amplifier 311, an integrating capacitor 312 connected between input and output terminals of the operational amplifier 311, a switch 313 connected in parallel to the integrating capacitor 312, and an integrating resistor 314.

The switch 313 of the analog integration circuit 306 is normally held in the ON state, discharging charges stored in the integrating capacitor 312. When the rectangular wave ④ or ⑤, which is applied to the input terminal 301 of the one fractional T-V converter, rises and the D flip-flop 302 yields the H-logic output, the switch 313 is turned OFF. At the same time, the integration time control circuit 308 is released from its reset state. A flip-flop 316, which forms the integration time control circuit 308, is released from its initialized reset state and until it is supplied at its trigger terminal T with a trigger signal, it provides an L-logic output at its Q output, retaining the analog switch 307 in the ON state. Accordingly, when the switch 313 is turned ON by the Q output from the afore-said flip-flop 302, the analog integration circuit 306 immediately starts an integration.

The integration time of the analog integration circuit 306 is defined by the frequency dividing ratio 1/K of a frequency divider 315 which forms the integration time control circuit 308. That is, when released from its reset state by the Q output of the flip-flop 302, the frequency divider 315 frequency divides the clock pulses ③ and, when having counted K clock pulses, it applies the trigger signal to the flip-flop 316.

When supplied with the trigger signal, the flip-flop 316 reads thereinto an H-logic input applied at its data terminal and provides an H-logic output at its output terminal Q, turning OFF the analog switch 307. In this embodiment the integration time of each of the first and second fractional T-V converters 103 and 104 is thus defined to the time from the rise of the input pulse ② to the application of the K-th clock pulse ③.

The integrating operation stops when the supply of an integrating voltage −E to the analog integration circuit 306 is stopped upon turning-OFF of the analog switch 307. One of the fractional T-V converters is kept out of the integrating operation until after the next input pulse ② is applied and its fractional time is converted by the other fractional T-V converter into a voltage signal, as shown in FIG. 3S or 3T.

The fractional time of the next input pulse is converted by the other fractional T-V converter into the voltage signal in the same manner as described above. The voltage signals corresponding to the two fractional times, thus obtained with the two fractional T-V converters 103 and 104, are provided to the analog subtractor 106, wherein a later one of the voltage signal is subtracted from the earlier voltage signal, obtaining the difference therebetween as depicted in FIG. 3U. When the difference is thus obtained, a reset signal ⑰ or ⑱ is applied via an OR gate 318 to a reset terminal R of the D flip-flop 302, resetting the fractional T-V converters 103 and 104.

An AND gate 317 constitutes means for extracting a signal representing the state in which the fractional time is being converted into the voltage signal, and the AND gate 317 provides at an output terminal 319 a pulse ⑥ or ⑦ shown in FIG. 3F or 3G. The pulse ⑥ or ⑦ is applied to a controller 115, wherein it is utilized for the generation of control signals which are used in respective parts.

Turning back to FIG. 2, the controller 115 comprises OR gates 116, 117, 118 and 119, AND gates 121, 122, 123 and 124, JK flip-flops 125, 126 and 127, a D flip-flop 128, a frequency divider 129, and monostable multivibrators 131 and 132.

The OR gate 116 forms means by which the pulses ⑥ and ⑦ from the fractional T-V converters 103 and 104 are combined into a signal ⑧ of one series. The pulse 8 thus obtained is applied to a trigger terminal T of the JK flip-flop 125 via the OR gate 117 and a trigger terminal T of the JK flip-flop 126 via the AND gate 123 and the OR gate 118.

The JK flip-flop 126 yeilds a rectangular wave signal ⑪ depicted in FIG. 3K. The rectangular wave signal ⑪ is applied to the AND gate 107, through which the clock pulses ③ from a clock generator 110 are provided to the counter 108 while the rectangular wave signal ⑪ is high-level. FIG. 3L shows the pulses ⑫ which are applied to the counter 108. The counter 108 counts the pulses ⑫ and the count value is converted by the D-A converter 109 to an analog voltage ㉒, which is provided to the adder 111.

A processing time $\tau_M$ is provided for producing an output voltage ㉓ corresponding to a period in connection with each input pulse ② and discharging the integrating capacitors 312 in the first and second fractional T-V converters 103 and 104 by pulses ⑰ and ⑱. The processing time $\tau_M$ begins at a clock pulse where the integrating operation of each of the fractional T-V converters 103 and 104 completes and ends at the time point of having counted M clock pulses.

To provide the processing time $\tau_M$, the count value of the counter 108 is set to a value smaller than the actual one by M. On this account, this embodiment employs a presetable counter as the counter 108, and in the initial state in which it starts the counting, a numerical value M preset in a register 120 is preset in the counter 108 so that the latter may start the counting from the preset value M.

A control signal ⑬ for controlling the change-over switch 105 is produced by the JK flip-flop 127. The JK flip-flop 127 yields the control signal 13 of a rectangular wave which reverses its polarity upon each fall of a signal ⑨, i.e. upon each termination of the processing time $\tau_M$, as depicted in FIG. 3M. The control signal ⑬ is applied to the change-over switch 105 to control its switching operation. In this embodiment, the change-over switch 105 is arranged so that its movable contacts C are connected to contacts A or B, depending on whether the control signal ⑬ is high- or low-level.

With the movable contacts C connected to the contacts A, the change-over switch 105 provides therethrough the output of the first fractional T-V converter 103 onto the signal path 113 and the output of the second fractional T-V converter 104 onto the signal path 114. With the movable contacts C connected to the contacts B, the change-over switch 105 provides therethrough the output of the first fractional T-V converter 103 onto the signal path 114 and the output of the second fractional T-V converter 104 onto the signal path 113.

Figure 5:
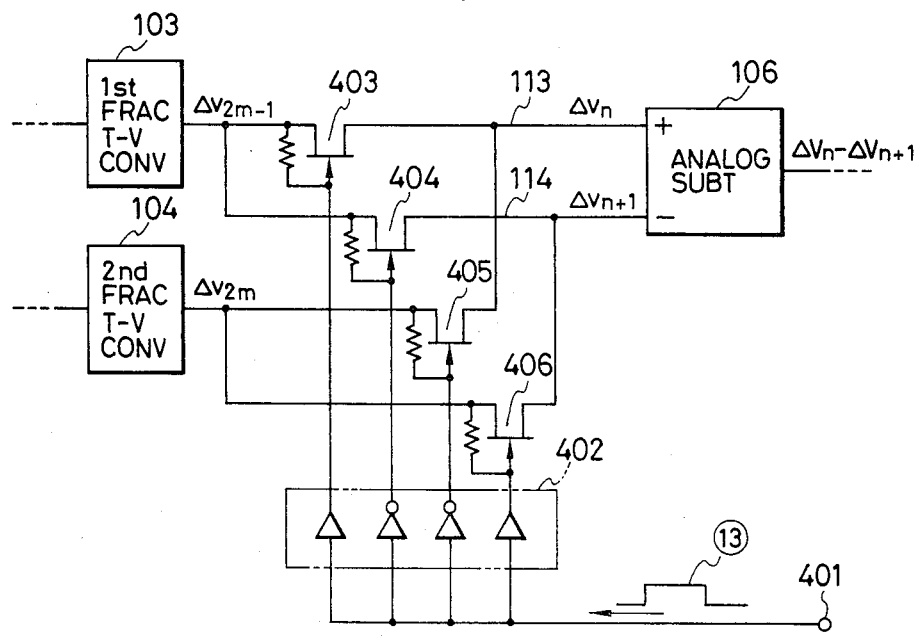
FIG. 5 is a circuit diagram showing a specific operative example of a change-over switch for use in the embodiment of the present invention.

FIG. 5 illustrates a specific operative example of the change-over switch 105. The control signal 13 is applied to a control input terminal 401, from which it is provided via a level converter 402 to gates of switching elements 403 to 406, turning ON and OFF the switching elements 403 and 406 and those 404 and 405 alternately with each other each time a fixed time interval $M \times T_0$ has elapsed after completion of the integration at either of the first and second fractional T-V converters 103 and 104. By this switching operation, a fraction signal $\Delta v_{2m-1}$ from the first fractional T-V converter 103 and a fraction signal $\Delta v_{2m}$ from the second fractional T-V converter 104 are alternately switched between them, and a fraction signal $\Delta v_n$ obtained with respect to one input pulse ② is provided on the signal path 113 and a fraction signal $\Delta v_{n+1}$ obtained with respect to the next input pulse ② is provided on the signal path 114. The signal paths 113 and 114 are connected to plus and minus terminals of the analog subtractor 106, respectively.

With such an arrangement, the subtraction of the output of the second fractional T-V converter 104 from the output of the first fractional T-V converter 103 and the subtraction of the latter from the former can alternately be switched between them, by controlling the change-over switch 105 to switch in synchronism with the period of the input pulse ②.

As a result of this, the analog subtractor 106 yields at its output a difference signal ㉑ by subtracting, from the voltage signal $\Delta V_n$ obtained at the preceding timing, the voltage signal $\Delta V_{n+1}$ obtained at the current timing, that is, $\Delta V_n - \Delta V_{n+1}$ (FIG. 3U). The difference signal ㉑ from the analog subtractor 106 and the output signal ㉒ (FIG. 3V) from the D-A converter 109 are added together by the adder 111. The added output from the adder 111 is sample-held in a sample hold circuit 112, the output of which is provided at an output terminal 133. The sample holding by the sample hold circuit 112 is timed by a pulse ⑮ (FIG. 30) which is yielded from the monostable multivibrator 131. The pulse ⑮ from the monostable multivibrator 131 is also applied to the monostable multivibrator 132. At the timing of the fall of the pulse ⑮ the monostable multivibrator 132 is triggered, generating the pulse ⑯. The pulse ⑯ is provided via the OR gate 119 to a preset terminal PS of the counter 108, presetting therein the initial value M at the rise of the pulse ⑯, for instance.

The pulse ⑯ is applied to the two AND gates 121 and 122 as well. These two AND gates 121 and 122 are controlled to be enabled and disabled alternately with each other, by the control signal ⑬ from the JK flip-flop 127, in synchronism with the period of the input pulse ②. Accordingly, the successive pulses ⑯ are distributed, by the two AND gates 121 and 122, into pulse signals ⑰ and ⑱ of two series, as shown in FIGS. 3Q and 3R. The pulse signals ⑰ and ⑱ of the two series are provided to the first and second fractional T-V converters 103 and 104, respectively, thereby alternately initializing their integration circuits 306 and integration time control circuits 308.

In the embodiment described above, periods $P_1, P_2, \ldots$ are expressed, from the timing chart of FIG. 3, in the same manner as expression (1), as follows:

$$P_1 = N_1 T_0 + \Delta T_1 - \Delta T_2$$
$$P_2 = N_2 T_0 + \Delta T_2 - \Delta T_3$$
$$P_3 = N_3 T_0 + \Delta T_3 - \Delta T_4$$
$$\vdots$$

In general, the following relation holds:

$$P_n = N_n T_0 + \Delta T_n - \Delta T_{n+1} \qquad (4)$$

where $\Delta T_n$ and $\Delta T_{n+1}$ are elapsed times from the rise of nth and (n+1)th input pulses to Kth clock pulses, respectively, K being determined by the frequency dividing number of the frequency divider 315 included in the integration time control circuit 308 and being selected equal to or greater than 2. The reason for this is that when K=1, the above-mentioned $\Delta T_n$ and $\Delta T_{n+1}$ may sometimes become zero, rendering the integrating circuit inoperable. The value of $N_n$ indicates the count value of the counter 108 shown in FIG. 1. As mentioned previously, the counter 108 is a presetable counter, in which the frequency dividing number M of the frequency divider 129 is preset.

Figure 3:
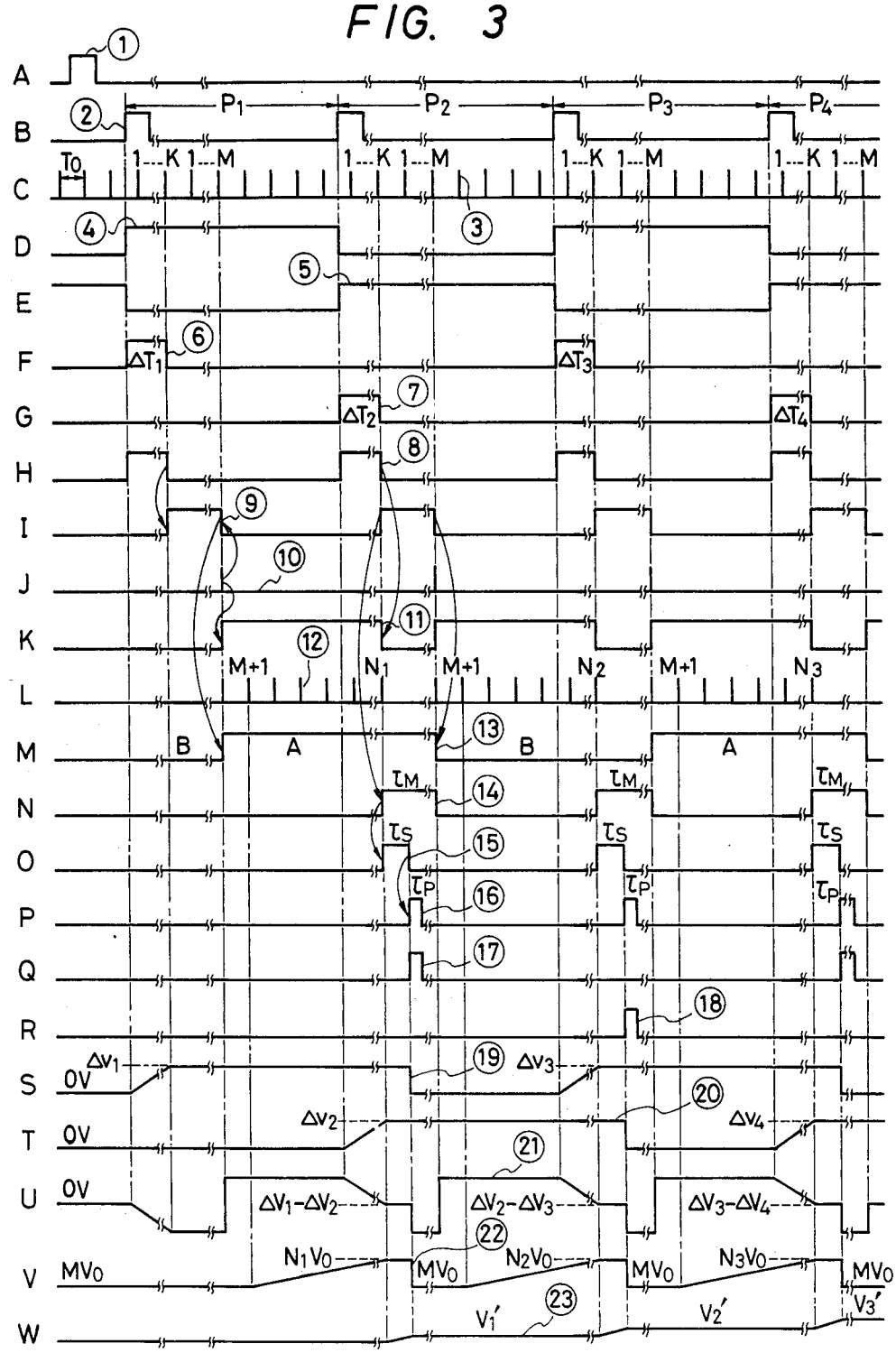
FIG. 3 shows waveform diagrams, for explaining the operation of the present invention.

The frequency dividing number M of the frequency divider 129 is chosen so that it may bear the following relationship to $\tau_S$ and $\tau_P$ shown in FIG. 3.

$$MT_0 > \tau_S + \tau_P \qquad (5)$$

where $T_0$ is the clock period, $\tau_S$ is a sample time for the sample hold circuit 112, and $\tau_S$ is the time for presetting the counter 108 or resetting each of the fractional T-V converters 103 and 104.

The counted output $N_n$ of the counter 108 is applied to the D-A converter 109, by which it is converted into a voltage $N_n \cdot V_0$, where $V_0$ is a constant step of voltage value by which the output voltage signal ㉒ of the D-A converter 109 varies whenever the counter 108 is incremented or decremented by one. The voltage value $V_0$ is selected 10 times larger than the minimum resolution of the D-A converter 109 when a digit one order lower than the digit of $V_0$ is assigned to the value of the difference signal ㉑.

As a result of this, the time interval $N_n \cdot T_0$ which is determined by the count value $N_n$ and the period $T_0$ of clock pulses ③ is converted to the dimension of voltage, that is, $N_n \cdot V_0$.

The fractional times $\Delta T_{2m-1}$ and $\Delta T_{2m}$ are converted into voltage as follows:

$$\Delta v_{2m-1} = (E/CR)\Delta T_{2m-1} \text{ for odd-numbered input pulses} \qquad (6)$$

$$\Delta v_{2m} = (E/CR)\Delta T_{2m} \text{ for even-numbered input pulses} \qquad (7)$$

where E is an integration voltage which is provided via the switch 307 to the integrating circuit 306 and CR is an integration time constant which is determined by the values of the capacitor 312 and the resistor 314 shown in FIG. 4. These voltages $\Delta v_{2m-1}$ and $\Delta v_{2m}$, when applied to the change-over switch 105, are reordered into a succession of $\Delta v_n$ and $\Delta v_{n+1}$ one after the other. Hence, $$\Delta v_n = (E/CR)\Delta T_n \qquad (8)$$

$$\Delta v_{n+1} = (E/CR)\Delta T_{n+1} \qquad (9)$$

Figure 6:
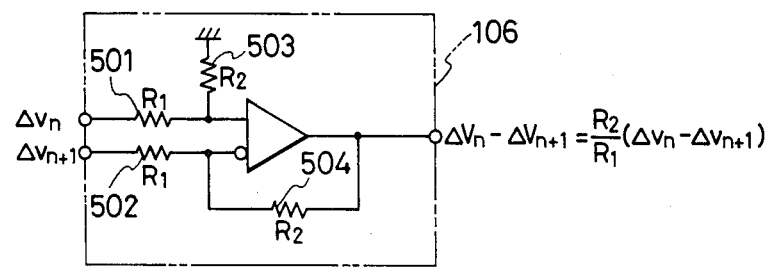
FIG. 6 is a circuit diagram showing a specific operative example of an analog subtractor for use in the present invention.

FIG. 6 illustrates a specific operative example of the analog subtractor 106. Letting the values of resistors 501 and 502 be equal to each other and be represented by $R_1$ and the values of resistors 503 and 504 be equal to each other and be represented by $R_2$, the outputs $\Delta V_n$ and $\Delta V_{n+1}$ of the subtractor 106 which are provided therefrom when one of its input voltages $\Delta v_n$ and $\Delta v_{n+1}$ is made zero become as follows:

$$\Delta V_n = (R_2/R_1)\Delta v_n, \; \Delta V_{n+1} = (R_2/R_1)\Delta v_{n+1} \qquad (10)$$

Accordingly, the following expression holds:

$$\Delta V_n - \Delta V_{n+1} = (R_2/R_1)\cdot(\Delta v_n - \Delta v_{n+1}) \qquad (11)$$

Since this output is applied to the adder 111 for addition to the output $N_n \cdot V_0$ of the D-A converter 109, they must have the same scale. To this end, the following weighting is required.

$$|\Delta V_n - \Delta v_{n+1}|_{MAX} = V_0 \qquad (12)$$

From expression (8 to (12), $$\begin{aligned} V_0 &= R_2/R_1 \cdot |\Delta v_n - \Delta v_{n+1}|_{MAX} \\ &= (R_2/R_1) \cdot (E/CR) \cdot |\Delta T_n - \Delta T_{n+1}|_{MAX} \\ &= (R_2/R_1) \cdot (E/CR) \cdot T_0 \end{aligned} \qquad (13)$$

Therefore, the amplification fractor $R_2/R_1$ that is needed for the analog subtractor 106 is as follows:

$$R_2/R_1 = CRV_0/ET_0 \qquad (14)$$

Thus, each period $P_n$ of successive two input pulses ② given by expression (1) can be converted, by use of expressions (8), (9), (10) and (14), into the voltage $V_n$ given by the following expression:

$$V_n = N_n V_0 + \Delta V_n - \Delta V_{n+1} \tag{15}$$

Figure 7:
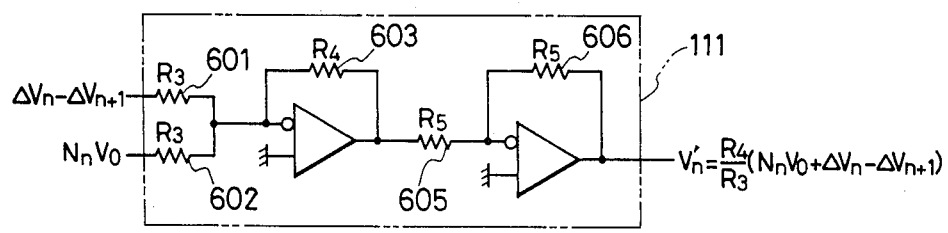
FIG. 7 is a circuit diagram showing a specific operative example of an adder for use in the embodiment of the present invention.

FIG. 7 illustrates a specific operative example of the adder 111. Letting values of resistors 601 and 602 be equal to each other and be represented by $R_3$ and the value of a resistor 603 by $R_4$, the amplification factor of the adder 111 is determined by $R_4/R_3$.

Consequently, the result of addition, $V_n'$, of the input signal ($\Delta V_n - V_{n+1}$) and the D-A converter output $N_n \cdot V_0$ is provided in the following form:

$$V_n' = (R_4/R_3) \cdot (N_n V_0 + \Delta V_n - \Delta V_{n+1}) \tag{16}$$

Comparison of expressions (15) and (16) shows that the output voltage $V_n'$ of the adder 111 is proportional to the voltage $V_n$ and hence proportional to the period $P_n$.

In the foregoing description the gate signal ⑪ shown in FIG. 3K is substantially the same as an inverted version of the signal ⑨ shown in FIG. 3I, and accordingly the $\overline{Q}$ output of the flip-flop 125 may also be applied, as a gate signal, directly to the AND gate 107. In such a case, the AND gate 123, the OR gate 118, and the flip-flop 126 can be dispensed with. Furthermore, since the output voltage $V_n'$ ㉓ obtained in relation to and immediately after the first input pulse ② (FIG. 3B), that is, an output voltage earlier than $V_1'$ in FIG. 3W, may be simply ignored, it is also possible to utilize an arrangement in which the flip-flop 128 and the AND gate 124 are further omitted and the Q output of the flip-flop 125 is applied directly to the trigger terminal T of the monostable multivibrator 131.

As described above, according to the present invention, the fractional times between the successive input pulses ② and the clock pulses ③ are measured by the pair of fractional T-V converters 103 and 104 alternately with each other, and the measured outputs are applied to the change-over switch 105, the switching operation of which allows the subtractor 106 to subtract, from the fractional time obtained in relation to any input pulse, the fractional time obtained in relation to the next input pulse.

As a result of this, the fractional times between the input pulses and the clock pulses can be obtained successively, and consequently the voltage signals $V_1', V_2', V_3', \ldots V_n'$ corresponding to the periods $P_1, P_2, P_3, \ldots P_n$ each of the successive two input pulses can be yielded in succession at the output terminal 133.

For example, when an oscilloscope is connected to the output terminal 133, a voltage waveform corresponding to a variance in the speed of a rotating member can be displayed on the oscilloscope.

When a spectrum analyzer is connected to the output terminal 133, a frequency analysis can be made of a variance in the speed of the rotating member. Accordingly, a variance in the speed of a rotating machine such as a precision motor or engine can be measured with high precision.

It will be apparent that many modifications and variations may be effected without departing from the scope of the novel concepts of the present invention.

What is claimed is:

1. A successive period-to-voltage converting apparatus comprising:

signal detecting means for yielding a detection signal synchronized with the leading or trailing edge of each of a series of input pulses;

clock generating means for generating clock pulses of a fixed period;

first and second fractional time-to-voltage converting means which alternately respond to the detected output of the signal detecting means to start the integration of a reference voltage and stop the integration upon arrival of a Kth (where K is a positive integer) clock pulse after the initiation of the integration and then convert fractional times defined by the time intervals between the detections of the input pulses and the applications of the Kth clock pulse into voltage signals $\Delta v_{2m-1}$ and $\Delta v_{2m}$ (where m is a positive integer) alternately with each other, for the series of input pulses;

change-over switching means whereby earlier and later ones of two successive voltage signals alternately output from the first and second fractional time-to-voltage converting means are provided, as voltage signals $\Delta v_n$ and $\Delta v_{n+1}$, on first and second signal paths, respectively;

analog subtracting means which is supplied with the voltage signals $\Delta v_n$ and $\Delta v_{n+1}$ from the first and second signal paths and obtains a difference signal between them, by subtracting the voltage signal $\Delta v_{n+1}$, which corresponds to the fractional time of a later one of two successive pulses of the series of input pulses, from the voltage signal $\Delta v_n$ corresponding to the fractional time of the earlier one of the two successive pulses;

gate means for extracting clock pulses present in a period corresponding to one period defined by two successive pulses of the series of input pulses;

counter means for counting the clock pulses extracted by the gate means;

D-A converting means for converting the count value of the counter means into analog form;

adding means for adding together the voltage signal from the D-A converting means and the difference signal from the analog subtracting means; and control means whereby, after stopping the integration by one of the first and second fractional time-to-voltage converting means, the other of them is reset and the change-over switching means is caused to perform the switching operation.

2. The apparatus of claim 1, wherein the first and second fractional time-to-voltage converting means each include integrating means responsive to the detected output of the signal detecting means to start the integration of the reference voltage and integration period determining means which starts counting of the clock pulses in response to the detected output of the signal detecting means and, when having counted K clock pulses, stops the integrating means from the integrating operation.

3. The apparatus of claim 1 wherein the control means includes means for determining a holding period during which to hold the voltage signal, which is the result of the integration by one of the first and second fractional time-to-voltage converting means, at least until after the other of them is stopped from the integrating operation.

4. The apparatus of claim 3, wherein the holding period determining means includes first pulse generating means responsive to the stopping of the integrating operation of the other of the first and second fractional time-to-voltage converting means to generate a first pulse of a fixed width $\tau_S$ and second pulse generating means responsive to the termination of the first pulse to generate a second pulse of a fixed width $\tau_P$, the second pulse being applied to the one of the first and second fractional time-to-voltage converting means to thereby reset it.

5. The apparatus of claim 4, wherein the sum of the widths of the first and second pulses is selected smaller than M (where M is a positive integer) times of the period of the clock pulse.

6. The apparatus of claim 4, wherein the adding means includes sample holding means for holding its output, the sample holding means holding the output voltage of the adding means upon each application of the first pulse to the former.

7. The apparatus of claim 1, wherein the control means includes 1/M (where M is a positive integer) frequency dividing means which starts frequency-dividing the clock pulses down to 1/Mth thereof in response to the stopping of the integrating operation of one of the first and second fractional time-to-voltage converting means, and gate signal generating means for creating a gate signal of a duration from the first frequency-divided output of the 1/M frequency dividing means to the stopping of the next integrating operation of the other of the first and second fractional time-to-voltage converting means, the gate signal being applied to the gate means to permit the passage therethrough of the clock pulses for the duration of the gate signal.

8. The apparatus of claim 7, wherein the control means includes means for determining a holding period during which to hold the voltage signal, which is the result of the integration by one of the first and second fractional time-to-voltage converting means, at least until after the other of them is stopped from the integrating operation.

9. The apparatus of claim 8, wherein the holding period determining means includes first pulse generating means responsive to the stopping of the integrating operation of the other of the first and second fractional time-to-voltage converting means to generate a first pulse of a fixed width $\tau_S$ and second pulse generating means responsive to the termination of the first pulse to generate a second pulse of a fixed width $\tau_P$, the second pulse being applied to the one of the first and second fractional time-to-voltage converting means to thereby reset it.

10. The apparatus of claim 9, wherein the sum of the widths of the first and second pulses is selected smaller than M times of the period of the clock pulse.

11. The apparatus of claim 9, wherein the adding means includes sample holding means for holding its output, the sample holding means holding the output voltage of the adding means upon each application of the first pulse to the former.

12. The apparatus of claim 7, wherein the counter means includes a preset counter in which M is preset whenever the counter means starts the counting operation.

13. The apparatus of claim 7, wherein the control means includes means whereby the change-over switching means is caused to perform the switching operation upon each provision of the first frequency-divided output from the 1/M frequency dividing means after stopping of the integrating operation of each of the first and second fractional time-to-voltage converting means.

14. The apparatus of claim 2, wherein the control means includes means for determining a holding period during which to hold the voltage signal, which is the result of the integration by one of the first and second fractional time-to-voltage converting means, at least until after the other of them is stopped from the integrating operation.

15. The apparatus of claim 8, wherein the counter means includes a preset counter in which M is preset whenever the counter means starts the counting operation.

16. The apparatus of claim 9, wherein the counter means includes a preset counter in which M is preset whenever the counter means starts the counting operation.

17. The apparatus of claim 10, wherein the counter means includes a preset counter in which M is preset whenever the counter means starts the counting operation.

18. The apparatus of claim 11, wherein the counter means includes a preset counter in which M is preset whenever the counter means starts the counting operation.

19. The apparatus of claim 8, wherein the control means includes means whereby the change-over switching means is caused to perform the switching operation upon each provision of the first frequency-divided output from the 1/M frequency dividing means after stopping of the integrating operation of each of the first and second franctional time-to-voltage convening means.

20. The apparatus of claim 9, wherein the control means includes means whereby the change-over switching means is caused to perform the switching operation upon each provision of the first frequency-divided output from the 1/M frequency dividing means after stopping of the integrating operation of each of the first and second franctional time-to-voltage convening means.

21. The apparatus of claim 10, wherein the control means includes means whereby the change-over switching means is caused to perform the switching operation upon each provision of the first frequency-divided output from the 1/M frequency dividing means after stopping of the integrating operation of each of the first and second franctional time-to-voltage convening means.

22. The apparatus of claim 11, wherein the control means includes means whereby the change-over switching means is caused to perform the switching operation upon each provision of the first frequency-divided output from the 1/M frequency dividing means after stopping of the integrating operation of each of the first and second franctional time-to-voltage convening means.

* * * * *

UNITED STATES PATENT AND TRADEMARK OFFICE
CERTIFICATE OF CORRECTION

PATENT NO. : 4,769,798

DATED : September 6, 1988

INVENTOR(S) : Hayashi

It is certified that error appears in the above-identified patent and that said Letters Patent is hereby corrected as shown below:

PAGE 1 OF 2

Col. 4, line 4, "1" should be -- ① --.

Col. 5, line 49, "8" should be -- ⑧ --;

Col. 6, line 35, "13" should be -- ⑬ --.

Col. 8, line 51, (Expression (12)), "$\Delta v_{n+1}$" should be -- $\Delta V_{n+1}$ --.

Col. 9, line 10, "$V_{n+1}$" should be -- $\Delta V_{n+1}$ --.

Col. 10, line 55, "1" should be --1,--.

UNITED STATES PATENT AND TRADEMARK OFFICE
CERTIFICATE OF CORRECTION

PATENT NO. : 4,769,798

DATED : September 6, 1988

INVENTOR(S) : Hayashi

It is certified that error appears in the above-identified patent and that said Letters Patent is hereby corrected as shown below:

Col. 12, (claim 19), line 37, "franctional" should be --fractional--; "convening" should be --converting--;

Col. 12, (claim 20), line 44, "franctional" should be --fractional--; "convening" should be --converting--;

Col. 12, (claim 21), line 51, "franctional" should be --fractional--; "convening" should be --converting--;

Col. 12, (claim 22), line 58, "franctional" should be --fractional--; "convening" should be --converting--;

Signed and Sealed this

Seventh Day of March, 1989

Attest:

DONALD J. QUIGG

*Attesting Officer*  *Commissioner of Patents and Trademarks*